(12) United States Patent
Bash et al.

(10) Patent No.: US 7,248,942 B2
(45) Date of Patent: Jul. 24, 2007

(54) AIRFLOW DETECTION SYSTEM HAVING AN AIRFLOW INDICATING DEVICE

(75) Inventors: Cullen E. Bash, San Francisco, CA (US); George Forman, Port Orchard, WA (US); Ratnesh Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 154 days.

(21) Appl. No.: 10/780,631

(22) Filed: Feb. 19, 2004

(65) Prior Publication Data
US 2005/0187664 A1 Aug. 25, 2005

(51) Int. Cl.
G06F 19/00 (2006.01)
(52) U.S. Cl. ............ 700/213; 700/179; 73/204.26
(58) Field of Classification Search ............ 700/213, 700/245, 276, 214, 79, 229, 300; 73/204.26, 73/204.16, 204.19; 36/700, 687; 718/100; 709/100; 67/132; 374/109
See application file for complete search history.

(56) References Cited

U.S. PATENT DOCUMENTS

| | | | | |
|---|---|---|---|---|
| 5,497,057 A | * | 3/1996 | Danielson et al. ............ | 318/371 |
| 5,980,194 A | * | 11/1999 | Freerks et al. ............ | 414/754 |
| 6,158,432 A | * | 12/2000 | Biondi et al. ............ | 128/204.21 |
| 6,283,380 B1 | * | 9/2001 | Nakanishi et al. ............ | 236/49.3 |
| 6,557,357 B2 | * | 5/2003 | Spinazzola et al. ............ | 62/89 |
| 6,776,817 B2 | * | 8/2004 | Lentz et al. ............ | 73/204.26 |
| 2002/0161480 A1 | * | 10/2002 | Kakutani et al. ............ | 700/245 |
| 2003/0067745 A1 | | 4/2003 | Patel et al. | |
| 2003/0207243 A1 | * | 11/2003 | Shen et al. ............ | 434/322 |
| 2003/0213851 A1 | * | 11/2003 | Burd et al. ............ | 236/44 A |
| 2003/0221821 A1 | | 12/2003 | Patel et al. | |
| 2004/0130442 A1 | * | 7/2004 | Breed et al. ............ | 340/443 |
| 2004/0243280 A1 | | 12/2004 | Bash et al. | |
| 2004/0256474 A1 | * | 12/2004 | Park et al. ............ | 236/51 |
| 2005/0088475 A1 | * | 4/2005 | Medin ............ | 347/17 |
| 2005/0114892 A1 | * | 5/2005 | Chan ............ | 725/63 |

OTHER PUBLICATIONS

R. Andrew Russell et al., A novel airflow sensor for miniature mobile robots, Elsevier Science Ltd., 21 julne 2000, pp. 935-942.*
R Andrew Russell et al., Sesning Airflow by a humaniod Robot, Monash University, Nov. 29, 2002, pp. 175-179.*
R. oder and Airflow: Complementary sense for a Humanoid robot, IEEE, May 2002, pp. 1842-1847.*

* cited by examiner

*Primary Examiner*—Kidest Bahta
(74) *Attorney, Agent, or Firm*—Richard P. Lange

(57) ABSTRACT

According to an embodiment, the present invention pertains to a system for detecting airflow in a room. The system includes an airflow indicating device having a movable component whose movement substantially corresponds to airflow in a vicinity of the airflow indicating device. The system also includes cooling system components and a computer system configured to control the cooling system components substantially based upon movement of the movable component.

43 Claims, 6 Drawing Sheets

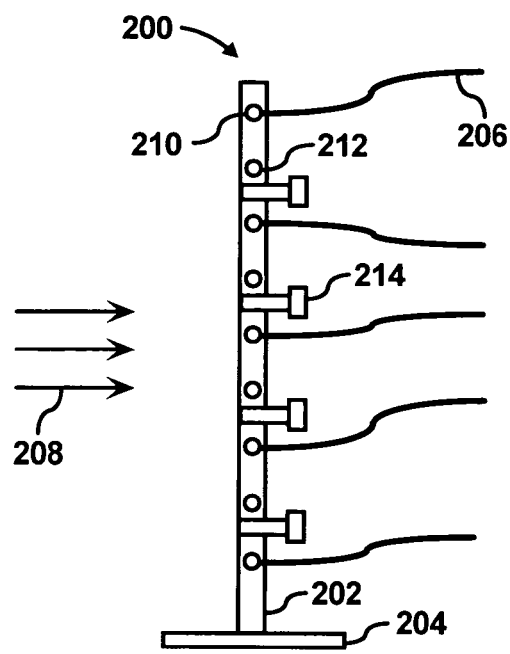
FIG. 2A
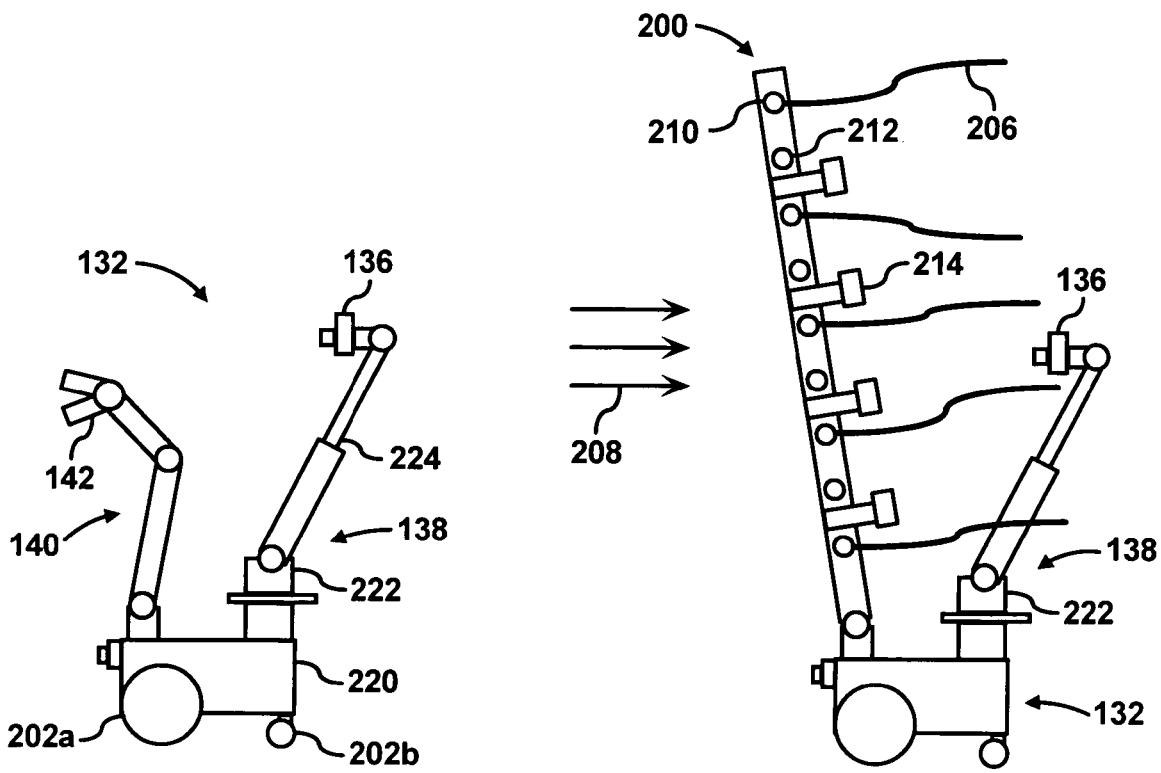
FIG. 2B
FIG. 2C

AIRFLOW DETECTION SYSTEM HAVING AN AIRFLOW INDICATING DEVICE

BACKGROUND OF THE INVENTION

A data center may be defined as a location, for instance, a room, that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate more than 200 systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically consume a minimum of about thirty (30) percent of the required operating energy to sufficiently cool the data centers. The other components, for example, condensers and air movers (fans), typically consume an additional twenty (20) percent of the required total operating energy. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, for instance, fans and blowers. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30-50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

Another factor that affects the efficiency of the cooling systems is the level of air re-circulation present in the data center. That is, conventional cooling systems are not designed to reduce mixing of the cooling fluid with heated air. Thus, cooling fluid delivered to the racks generally mixes with air heated by the components thereby decreasing the efficiency of heat transfer from the components to the cooling fluid. In addition, heated air mixes with the cooling fluid thereby decreasing the temperature of the air returning to the air conditioning unit and thus decreases the efficiency of the heat transfer at the air conditioning unit.

SUMMARY OF THE INVENTION

According to an embodiment, the present invention pertains to a system for detecting airflow in a room. The system includes an airflow indicating device having a movable component whose movement substantially corresponds to airflow in a vicinity of the airflow indicating device. The system also includes cooling system components and a computer system configured to control the cooling system components substantially based upon movement of the movable component.

BRIEF DESCRIPTION OF THE DRAWINGS

Features of the present invention will become apparent to those skilled in the art from the following description with reference to the figures, in which:

FIG. 2A illustrates a side elevational view of an airflow indicating device according to another embodiment of the invention;

FIG. 2B is a side elevational view of the robotic device illustrated FIG. 1A;

FIG. 2C is a side elevational view of the robotic device illustrated in FIG. 2B according to another embodiment of the invention;

DETAILED DESCRIPTION OF THE INVENTION

Figure 1A:
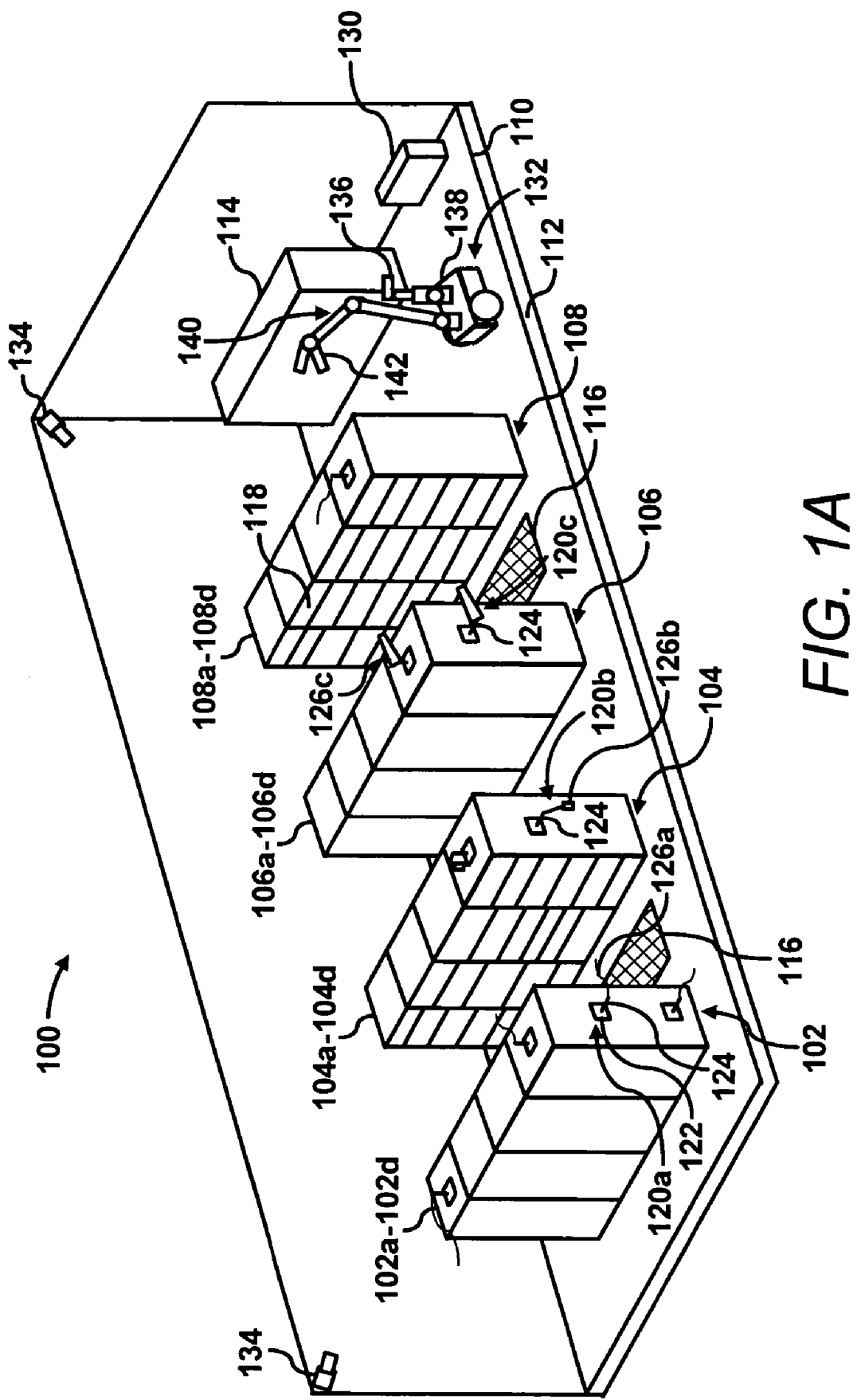
FIG. 1A shows a simplified perspective view of a room, e.g., a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated cooling fluid". For purposes of simplicity, "cooling fluid" may generally be defined as air that has been cooled by a cooling device, e.g., an air conditioning unit. In addition, "heated cooling fluid" may generally be defined as cooling fluid that has been heated. It should be readily apparent, however, that the terms "cooling fluid" are not intended to denote air that only contains cooled fluid and that "heated cooling fluid" only contains cooling fluid that has been heated. Instead, embodiments of the invention may operate with air that contains a mixture of heated cooling fluid and cooling fluid. In addition, cooling fluid and heated cooling fluid may denote gases other than air, e.g., refrigerant and other types of gases known to those of ordinary skill in the art that may be used to cool electronic components.

According to embodiments of the invention, a plurality of airflow indicating devices are positioned at various locations of a room, for instance, a data center. The airflow indicating devices comprise relatively simple configurations designed to visually indicate the directions in which air is flowing at the various locations of the room. In one example, the airflow indicating devices may include sensors, for instance, strain gauges, encoders, etc., designed to detect the airflow magnitudes at the various locations of the room. In another example, the airflow indicating devices may include temperature sensors as well as visual indicators of temperature measurements.

The airflow indicating devices may be employed to visually determine re-circulation of the air in the room. Re-circulation of air in the room may lead to inefficient cooling system operations as heated cooling fluid may be re-circulated back into the racks. For instance, this type of re-circulation may increase the temperature of the cooling fluid delivered to the components housed in the racks.

In a previously filed and co-pending application, the level of re-circulation in a room was determined through detection of temperatures at various locations. By comparing the various temperatures, a dimensionless parameter termed the "supply heat index" may be calculated, which correlates to re-circulation levels in various locations of the room. That application is U.S. patent application Ser. No. 10/446,854, filed on May 29, 2003, which is assigned to the assignee of the present disclosure and the disclosure of which is hereby incorporated by reference in its entirety. Although that patent application described methods of determining re-circulation of cooling fluid based upon various temperature measurements, that patent application did not disclose manners in which re-circulation could be detected around the sides or over the racks. In this respect, embodiments of the present invention are directed to providing visual indications of re-circulation at the various locations of the room.

In one example, the room may be provided with one or more imaging devices positioned to image the airflow indicating devices. In addition, or alternatively, one or more of the imaging devices may be positioned on a robotic device configured to traverse the room and image the airflow indicating devices. The images of the airflow indicating devices may be processed by a computer system configured to determine the airflow directions. The computer system may be configured as an energy manager configured to control operations of the cooling system components, for instance, vent tiles, CRAC units, etc., in the room. In one regard, the computer system may be configured to substantially base cooling system component operation decisions on the received images. Alternatively, the robotic device may function as the energy manager and may thus also be configured to substantially base cooling system component operation decisions on the received images. In any event, for instance, the decisions to manipulate the cooling system components may be based substantially on reducing re-circulation of heated cooling fluid.

In another example, a technician or other personnel may view the airflow indicating devices either directly or through the one or more imaging devices. The technician may make a determination of re-circulation in the room and may manually adjust cooling system components. In addition, or alternatively, the technician may input information to the computer system to vary the cooling system component operations.

Through implementation of various embodiments of the invention, information pertaining to airflow conditions, for instance, direction and/or magnitude, at various locations of a room may be detected through use of relatively simple and inexpensive airflow indicating devices. An energy manager may utilize the airflow condition information to make cooling system control decisions to, for instance, reduce the level of cooling fluid re-circulation in the room. In one respect, by reducing the level of cooling fluid re-circulation in the room, the cooling system components may be operated at relatively optimized energy levels. Therefore, the costs associated with operating a room containing electronic components may thus be reduced compared with conventional systems.

With reference first to FIG. 1A, there is shown a simplified perspective view of a room 100, e.g., a data center, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove. In addition, a more detailed description of the elements illustrated with respect to FIG. 1A may be found in commonly assigned U.S. Pat. No. 6,574,104, filed on Oct. 5, 2001, which is hereby incorporated by reference in its entirety.

The room 100 depicted in FIG. 1A represents a generalized illustration and other components may be added or existing components may be removed or modified without departing from the scope of the invention. For example, the room 100 may include any number of racks and various other apparatuses known to be housed in data centers. Thus, although the room 100 is illustrated as containing four rows of racks 102-108, it should be understood that the room 100 may include any number of racks, e.g., 100 racks, without departing from the scope of the invention. The depiction of four rows of racks 102-108 is thus for illustrative and simplicity of description purposes only and is not intended to limit the invention in any respect.

The room 100 is depicted as having a plurality of racks 102-108, for instance, electronics cabinets, aligned in substantially parallel rows. The racks 102-108 are illustrated as having open front sides such that the components 118 housed therein are visible. It should, however, be understood that embodiments of the invention may be practiced with racks having panels that cover the front sides of the racks 102-108 without departing from the scope of the invention. The rows of racks 102-108 are shown as containing four racks (a-d) positioned on a raised floor 110. A plurality of wires and communication lines (not shown) may be located in a space 112 beneath the raised floor 110. The space 112 may also function as a plenum for delivery of cooling fluid from a computer room air conditioner (CRAC) 114 to the racks 102-108. The cooling fluid may be delivered from the space 112 to the racks 102-108 through vent tiles 116 located between some or all of the racks 102-108. The vent tiles 116 are shown in FIG. 1A as being located between racks 102 and 104 and 106 and 108.

The CRAC 114 generally receives and cools heated cooling fluid. In addition, the CRAC 114 supplies the racks 102-108 with cooling fluid that has been cooled, e.g., cooled or chilled air, through, for example, a process as described below. The CRAC 114 may include components capable of varying the temperature and/or the volume flow rate of the cooling fluid delivered into the space 112 as described in the co-pending Ser. No. 10/721,264 patent application. In addition, aspects of the invention may be operated with constant speed compressors and/or constant speed fans as described in co-pending and commonly assigned U.S. application Ser. No. 10/303,761, filed on Nov. 26, 2002 and U.S. application Ser. No. 10/351,427, filed on Jan. 27, 2003, which are hereby incorporated by reference in their entireties.

Aspects of the invention may also be practiced in accordance with various principles disclosed in co-pending and commonly assigned U.S. patent application Ser. Nos. 10/262,879, filed on Oct. 3, 2002, and Ser. No. 10/210,040, filed on Aug. 2, 2002, the disclosures of which are hereby incorporated by reference in their entireties.

As disclosed in the above-identified co-pending applications, through operation of the vent tiles 116, the above-described devices, for instance, dynamically controllable returns, and/or the CRAC 114, global and zonal control of the cooling fluid flow and temperature may substantially be achieved. For instance, the flow regulating devices, e.g., louver systems and angled panels, generally provide local or rack level control of cooling fluid flow and the vent tiles 116 generally provide localized or zonal control of the cooling fluid flow to one or more of the racks 102-108. In addition, the CRAC 114 generally provides global control of the cooling fluid flow and temperature, e.g., cooling fluid having various characteristics to a plurality of racks, throughout various portions of the room 100. By virtue of the zonal and global control of the cooling fluid, the amount of energy consumed by the CRAC 114 in maintaining the components of the racks 102-108 within predetermined operating temperature ranges may substantially be reduced in comparison with conventional data center cooling systems.

The racks 102-108 are generally configured to house a plurality of components 118, e.g., computers, servers, monitors, hard drives, disk drives, etc., designed to perform various operations, e.g., computing, switching, routing, displaying, etc. These components 118 may comprise subsystems (not shown), for example, processors, micro-controllers, high-speed video cards, memories, semi-conductor devices, and the like to perform these functions. In the performance of these electronic functions, the components 118, and therefore the subsystems, generally dissipate relatively large amounts of heat. Because the racks 102-108 have generally been known to include upwards of forty (40) or more subsystems, they may transfer substantially large amounts of heat to the cooling fluid to maintain the subsystems and the components 118 generally within predetermined operating temperature ranges.

A relatively small number of components 118 are illustrated as being housed in the racks 102-108 for purposes of simplicity. It should, however, be understood that the racks 102-108 may include any number of components 118, e.g., forty or more components 118, without departing from the scope of the invention. In addition, although the racks 102-108 are illustrated as containing components 118 throughout the heights of the racks 102-108, it should be understood that some or all of the racks 102-108 may include slots or areas that do not include components 118 without departing from the scope of the invention.

The aisles between the rows of racks 102 and 104 as well as the aisles between the rows of racks 106 and 108 may be considered as "cool aisles" because these aisles receive cooling fluid from the vent tiles 116. The aisles between the rows of racks 104 and 106, for instance, may be considered as "hot aisles" because these aisles receive cooling fluid that may have been heated by the components 118 contained in the rows of racks 104 and 106.

Provided at various locations of the room 100 is a plurality of airflow indicating devices 120a-120c. Although three variations of the airflow indicating devices 120a-120c are illustrated in FIG. 1A, other known reasonably suitable airflow indicating devices may be employed without departing from the scope of the invention. In addition, although the airflow indicating devices 120a-120c are illustrated as being positioned at the various locations of the room 100, the airflow indicating devices 120a-120c may be positioned at various other locations, for instance, along walls of the room 100 or other apparatuses housed therein. Moreover, the variously located airflow indicating devices 120a-120c shown in FIG. 1A may be removed or repositioned. In this regard, the airflow indicating devices 120a-120c are depicted at their various locations for purposes of illustration and simplicity of description purposes and are not intended to limit the scope of the invention other than in manners described hereinbelow.

As will be described in greater detail hereinbelow, the airflow indicating devices 120a-120c are generally configured to provide a visual indication of airflow at the various locations of the room 100. The visual indication of airflow may be accomplished through various means as shown, for instance, by the various constructions of the airflow indicating devices 120a-120c. In addition, the airflow indicating devices 120a-120c may be positioned in areas of the room 100 where it is generally known that airflow may occur. For instance, the airflow indicating devices 120a-120c may be positioned at the ends of the rows of racks 102-108, on top of various racks 102-108, etc. As another example, the airflow indicating devices 120a-120c may be positioned at various heights along a rack, for instance, as shown with respect to the rack 102a. In this regard, airflow may be visualized at various heights with regard to, for instance, the racks 102-108.

In addition, the determination of the number of airflow indicating devices 120a-120c positioned at various locations of the room 100 may be based upon the degree of accuracy desired in detecting the airflow at, for instance, various heights with respect to the racks 102-108. Another factor in determining the locations and/or the number of airflow indicating devices 120a-120c employed may be based upon varying airflows known to exist at various heights with respect to the racks 102-108.

The airflow indicating devices 120a-120c may be composed of stands 122, supports 124, and movable components 126a-126c. The stands 122 may function as bases for the airflow indicating devices 120a-120c. The stands 122 may enable the airflow indicating devices 120a-120c to be positioned on substantially horizontal surfaces, for instance, the tops of the racks 102-108, without requiring the use of fasteners or other attaching means. In one regard, the stands 122 may be configured with sufficient weight to enable the airflow indicating devices 120a-120c to remain substantially stationary while air flows around or through the airflow indicating devices 120a-120c. The stands 122 may also enable attachment of the airflow indicating devices 120a-120c to substantially vertical or other non-horizontal surfaces. In this regard, the stands 122 may include surfaces through which fastening means, for instance, mechanical fasteners, adhesives, hook and loop fasteners, brackets, welds, etc., may be implemented to attach the airflow indicating devices 120a-120c to the various surfaces. Thus, for example, variously configured airflow indicating devices 120a-120c may be added, moved or replaced with relative ease.

The supports 124 may function to support and space the movable components 126a-126c away from, for instance, the racks 102-108. In one regard, the movable components 126a-126c may be spaced a distance away from the racks 102-108 to position the movable components 126a-126c in areas where the airflow may not be substantially affected by the racks 102-108. In addition, the movable components 126a-126c may be rotatably attached to the supports 124, for instance, swivel-mounted, to enable the movable components 126a-126c to move substantially freely with respect to the supports 124.

According to an example of the invention, the supports 124 may be provided with one or more sensors configured to detect the magnitude of the airflow around the respective airflow indicating devices 120a-120d. The one or more sensors may comprise any reasonably suitable device for detecting the magnitude of the force applied to the supports 124. For instance, the one or more sensors may comprise strain gauges. The strain gauges may comprise any reasonably suitable known strain gauges, for instance, strain gauges having mechanical, optical, acoustical, pneumatic, and electrical means for measuring deformation. Specific examples of suitable strain gauges are strain rosettes. The strain gauges may be calibrated to determine the magnitude of the airflow acting upon the airflow indicating devices 120a-120d.

Alternatively, the one or more sensors may comprise anemometers configured to detect the magnitudes of the airflows in the vicinities of the airflow indicating devices 120a-120d. Suitable anemometers may include, for instance, vane type anemometers and hot wire anemometers. The one or more sensors may each include a plurality of vane type anemometers positioned to detect the magnitudes of airflows in various directions with respect to, for instance, the supports 124.

Although not shown in FIG. 1A, the one or more sensors may be configured to display magnitude, for instance, through use of a liquid crystal display. In addition, or alternatively, the one or more sensors may be wired to, for instance a computer system 130 and may transmit the detected magnitudes to the computer system 130 through a wired protocol, such as IEEE 802.3, etc. As a further example, the one or more sensors may be configured to wirelessly transmit the detected information through for instance, a wireless protocol, such as IEEE 802.11b, 802.11g, wireless serial connection, Bluetooth, etc., or combinations thereof, to the computer system 130 and/or a robotic device 132.

The robotic device 132 generally includes means to enable the robotic device 132 to traverse the room 100. In one regard, the robotic device 132 may comprise a configuration and operate in manners similar to those described in co-pending and commonly assigned U.S. patent application Ser. No. 10/446,867 filed on May 29, 2003, and entitled "DATA CENTER ROBOTIC DEVICE". The disclosure contained in that application is hereby incorporated by reference in its entirety. Additional components associated with the robotic device 132 are described in greater detail hereinbelow.

As a further alternative example, the airflow indicating devices 120a-120c may be equipped with interface mechanisms configured to enable communications with the robotic device 132, which may also be equipped with an interface mechanism. In this example, the robotic device 132 may be configured to receive the detected information from the airflow indicating devices 120a-120c. The robotic device 132 may also be configured to convey the received information to the computer system 130 through an interface with either the computer system 130, through an interface with a network on which the computer system 130 is connected, or wirelessly to the computer system 130.

According to one example, imaging devices 134 may be positioned at various locations of the room 100 to image the airflow indicating devices 120a-120c. In this regard, the imaging devices 134 may be strategically positioned in the room 100 to image the variously located airflow indicating devices 120a-120c. In another regard, the imaging devices 134 may be rotatable to enable the imaging devices 134 to image variously located airflow indicating devices 120a-120c. In addition, the imaging devices 134 may be configured to move to various sections of the room 100, for instance, the imaging devices 134 may be mounted on tracks and may be configured to move along the tracks. The imaging devices 134 may comprise digital or analog cameras or video recorders, and the like. In addition, the imaging devices 134 may be configured to transmit the images to at least one of the computer system 130 and the robotic device 132. The transmission of the images may be effectuated through a wired protocol, such as IEEE 802.3, or a wireless protocol, such as IEEE 802.11b, 802.11g, wireless serial connection, Bluetooth, etc.

In addition, or alternatively, the robotic device 132 may be provided with an imaging device 136 configured to image the airflow indicating devices 120a-120c. The imaging device 136 may be positioned on a movable platform 138 of the robotic device 132. In one regard, through manipulation of the movable platform 138, the imaging device 136 may be positioned at various heights and/or angles with respect to the robotic device 132. Therefore, the imaging device 136 may obtain images of sensors devices 120a-120c that are variously located with respect to the robotic device 132. Alternatively, the imaging device 136 may be supported in a relatively fixed manner to the robotic device 132, without deviating from the scope of the invention.

The robotic device 132 may contain a memory configured to store the images obtained by the imaging device 136. In one example, the robotic device 132 may operate as an energy manager configured to control operations of various cooling system components, for instance, the CRAC unit 114, vent tiles 116, dynamically controllable returns, devices for substantially controlling the flow of cooling fluid into the racks 102-108, e.g., those devices described in co-pending and commonly assigned U.S. patent application Ser. Nos. 10/425,621 and 10/425,624, both of which were filed on Apr. 30, 2003, the disclosures of which are hereby incorporated by reference in their entireties, etc.

In this example, the robotic device 132 may include software and/or hardware designed to process the images and determine the airflow conditions indicated by the airflow indicating devices 120a-120c. Manners in which the robotic device 132 may determine the airflow conditions and operate the cooling system components based upon the airflow conditions are described in greater detail hereinbelow.

In another example, the robotic device 132 may operate as a means for communicating the images of the airflow indicating devices 120a-120c to, for instance, the computer system 130, which may function as the energy manager. In this example, the robotic device 132 may operate to store the images and to convey the stored images to the computer system 130. The computer system 130, in this example, may include software and/or hardware configured to process the images to determine airflow conditions indicated by the airflow indicating devices 120a-120c.

Manners in which the robotic device 132 and/or the computer system 130 may operate the various cooling system components are described, for instance, in co-pending and commonly assigned U.S. patent application Ser. No. 10/721,264 filed on Nov. 26, 2003, the disclosure of which is hereby incorporated by reference in its entirety.

In any event, the images may be processed to form atmospheric maps as disclosed in commonly assigned and co-pending U.S. patent application Ser. No. 10/123,403, filed on Apr. 17, 2002, the disclosure of which is hereby incorporated by reference in its entirety. As disclosed in that application, the atmospheric maps may be used to determine cooling system control schemes. In one example, the atmospheric maps may be compared to template maps, which may comprise desired atmospheric conditions in the room. In this example, cooling system control decisions may be based upon differences between the atmospheric maps and the template maps as disclosed in the Ser. No. 10/123,403 application.

The computer system 130 may also operate as a base station for the robotic device 132. In one regard, the computer system 130 may provide instructions to the robotic device 132. These instructions may include, for instance, the routes the robotic device 132 is to follow in the room 100 and may be based upon various routing algorithms as described, for instance, in the Ser. No. 10/721,264 application. As further described in that application, the computer system 130 may also include systems for recharging a battery of the robotic device 132. In one respect, the computer system 130 may include a charging pad and the robotic device 132 may include conductive elements configured to engage the charging pad and to receive electrical charge therethrough. The robotic device 132 may thus be configured to travel to the computer system 130 to communicate with the computer system 130 or to recharge its battery.

In addition, communications between the robotic device 132 and the computer system 130 may be effectuated through a wired protocol, such as IEEE 802.3, etc., or wireless protocols, such as IEEE 802.11b, 802.11g, wireless serial connection, Bluetooth, etc., or combinations thereof. If a wired protocol is implemented, the robotic device 132 may include an interface mechanism designed to create a hardwire connection to the computer system 130, which may also include an interface mechanism (not shown) complementary to the robotic device 132 interface mechanism. If a wireless protocol is implemented, the robotic device 132 and the computer system 130 may be configured or otherwise programmed to transmit signals to relatively short distances, for instance, within a few feet. In this regard, wireless communications between the robotic device 132 and the computer system 130 may be effectuated in manners such that their signals are substantially prevented from being transmitted to locations outside of the room 100, thereby reducing the possibilities of unwanted signal interceptions.

The robotic device 132 may also include an arm assembly 140 including a manipulator 142. Although the manipulator 142 may be used for various purposes, according to an example of the invention, the robotic device 132 may employ the arm assembly 140 and the manipulator 142 to position, re-position, or remove the airflow indicating devices 120a-120c.

Figure 1B:
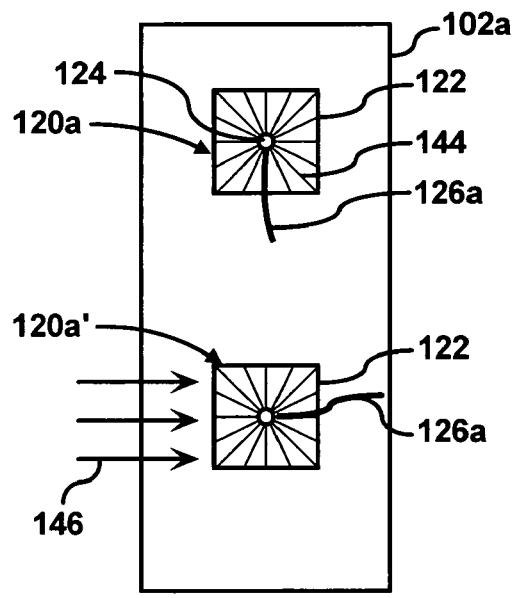
FIG. 1B illustrates a side-elevational view of a rack having airflow indicating devices attached thereon according to an embodiment of the invention.

FIG. 1B illustrates a side-elevational view of a rack 102a having airflow indicating devices 120a, 120a' attached thereon according to an embodiment of the invention. The rack illustrated in FIG. 1B may, for instance, comprise the rack 102a illustrated in FIG. 1A. Although two airflow indicating devices 120a, 120a' are illustrated in FIG. 1B, any number of airflow indicating devices 120a, 120a' may be provided without departing from the scope of the invention. The determination of the number of airflow indicating devices 120a, 120a' to be employed may be based upon the degree of accuracy desired in detecting the airflow at, for instance, various heights with respect to the rack 102a. Another factor in determining the locations and/or the number of airflow indicating devices 120a, 120a' employed may be based upon varying airflows known to exist at various heights of the rack 102a.

The movable components 126a of the airflow indicating devices 120a, 120a' generally comprise nearly massless streamers composed of, for instance, cellophane, spider silk, etc. In other words, the movable components 126a are configured and have sufficiently low weights to generally cause the movable components 126a to flow in the direction of airflow around the airflow indicating devices 120a, 120a'. Thus, as air flows in the vicinities of the airflow indicating devices 120a, 120', the airflow causes the movable components 126a to generally point in the direction of the airflow. The movable components 126a may comprise materials and/or colors that are relatively easily distinguishable from other colors in the room 100 to generally enable the movable components 126a to be relatively easily seen or imaged.

In addition, the movable components 126a may be attached to the supports 124 in any reasonably suitable manner to enable the movable components 126a to rotate with respect to the supports 124. For instance, means for attaching the movable components 126a to the supports 124 may include, adhesives, mechanical fasteners, etc. The attaching means may also include a bearing device to enable the movable components 126a to relatively freely rotate with respect to the supports 124.

The stands 122 are illustrated as comprising optional markings 144, which generally operate as visual aids for indicating the airflow direction. Thus, for instance, when there is little or no airflow around the airflow indicating device 120a, 120a', for instance, as shown with respect to the airflow indicating device 120a, the movable component 126 may point in a generally downward direction with respect to the rack 102a. However, as air, indicated by the arrows 146, flow around the airflow indicating device 120a, 120a', for instance, as shown with respect to the airflow indicating device 120a', the movable component 126a points in the direction of the air flow. In one regard, by determining the marking 144 to which the movable component 126a is pointing, the airflow direction may be relatively easily determined. It should be understood, however, that the markings 144 may be omitted, for instance, to obtain a general sense of the airflow direction, without departing from the scope of the invention.

Figure 1C:
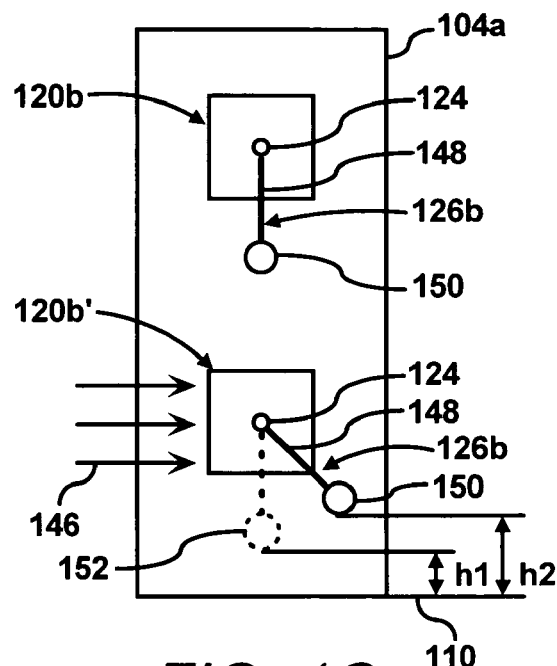
FIG. 1C illustrates a side-elevational view of a rack having airflow indicating devices attached thereon according to another embodiment of the invention.

FIG. 1C illustrates a side-elevational view of a rack 104a having airflow indicating devices 120b, 120b' attached thereon according to another embodiment of the invention. The rack illustrated in FIG. 1C may comprise, for instance, the rack 104a illustrated in FIG. 1A. Although two airflow indicating devices 120b, 120b' are illustrated in FIG. 1C, any number of airflow indicating devices 120b, 120b' may be provided without departing from the scope of the invention. The determination of the number of airflow indicating devices 120b, 120b' to be employed may be based upon the degree of accuracy desired in detecting the airflow at, for instance, various heights with respect to the rack 104a. Another factor in determining the locations and/or the number of airflow indicating devices 120b, 120b' employed may be based upon varying airflows known to exist at various heights of the rack 104a.

The airflow indicating devices 120b, 120b' illustrated in FIG. 1C generally comprise movable components 126b. The movable components 126b are composed of a relatively lightweight connecting device 148 attached to a movable mass 150. The connecting device 148 may comprise, for instance, the same or similar materials as described hereinabove with respect to the movable components 126a. In another example, the connecting device 148 may comprise a relatively rigid material and may be attached to the support 124 through a joint configured to enable the connecting device 148 and the movable mass 150 to rotate with respect to the support 124. The type of joint employed to connect the connecting device 148 to the support 124 may depend upon the degree of accuracy in determining the direction of airflow around the airflow indicating devices 120b, 120b'. For instance, if a relatively low level of accuracy is desired, a simple swivel joint may be employed. Alternatively, if a relatively high level of accuracy is desired, a universal joint may be employed.

The movable mass 150 may comprise a mass having sufficient weight to be relatively stable but sufficiently light to respond to the range of expected air flow magnitudes. The mass of the movable mass 150 may, for instance, be selected according to the expected range of airflow magnitudes in the room 100. In addition, the movable mass 150 may comprise any reasonably suitable material, for instance, plastic, metal, etc., capable of being moved by the expected range of airflow magnitudes in the room 100. Although the movable mass 150 is illustrated as comprising a relatively spherical configuration, the movable mass 150 may comprise any reasonably suitable configuration, for instance, cylindrical, rectangular, etc., without departing from the scope of the invention. The movable mass 150 may also comprise a planar disc to detect flow in a single rectilinear direction.

The movable component 126b of the airflow indicating device 120b is illustrated as pointing in a generally downward direction with respect to the rack 104a. In addition, the movable component 126b of the airflow indicating device 120b' shown with dashed marks indicates a starting position 152 for the movable component 126b. That is, when there is little or no air flow around the airflow indicating devices 120b, 120b', the movable components 126b may be at the starting position 152 due to gravity. However, once an appreciable amount of air, as indicated by the arrow 146, flows around the airflow indicating devices 120b, 120b', the movable components 126b are configured to rotate about the supports 124 as shown with respect to the airflow indicating device 120b'. The amount of air required to cause the movable components 126b to move may depend upon the weight and/or configuration of the movable components 126b. Thus, for instance, a spherical mass having a relatively light weight may require less amount of airflow to move as compared with a rectangular mass having a relatively heavy weight.

The direction in which the movable component 126b is rotated is a general indicator of the direction in which air is flowing around the respective airflow indicating device 120b, 120b'. Thus, for instance, as depicted in FIG. 1C, the airflow 146 has caused the movable component 126b to be rotated in a counter-clockwise direction from the starting position 152, which generally indicates that air is flowing from a left side of the rack 104a to a right side of the rack 104a. In addition, the magnitudes at which the air is flowing may be determined in various manners.

In one example, the magnitudes may be determined through a determination of the change in height of the movable mass 150. In this example, any known reasonably suitable calibration technique may be employed to determine a correlation between the magnitude of air flow and the level of rotation of the movable mass 150. Once the correlation is complete, the height (h1) of the movable mass 150 at the starting position 152 may be determined with respect to a reference location, for instance the raised floor 110. In addition, the height (h2) of the movable mass 150 after airflow is applied to the movable component 126b may also be determined with respect to the reference location. By comparing the heights (h1 and h2) with the correlated magnitude, the magnitude of the airflow causing the movable mass 150 to be rotated from the starting position 152 may be determined.

In another example, the supports 124 may be provided with a sensor (not shown), for instance, a strain gauge, an encoder, etc., to determine the magnitude of the airflow. Again, any known reasonably suitable calibration technique may be employed to determine a correlation between the information collected by the sensor and the airflow magnitude. If a strain gauge is employed, the level of strain applied on the supports 124 may be determined and correlated to a magnitude of the airflow. If an encoder is employed, for instance, the encoder may be positioned to detect the rotations of the movable components 126b with respect to the supports 124. The rotations detected by the encoder may be correlated to the magnitude of the airflow. In any regard, the information obtained by the sensor may be transmitted as described hereinabove with respect to FIG. 1A.

According to another example of the invention, the movable mass 150 may comprise a material configured to change colors depending upon its temperature. The movable mass 150 may be formed of the color changing material or it may, for instance, be coated with the color changing material. A more detailed description of suitable materials the movable mass 150 may comprise is disclosed in co-pending and commonly assigned U.S. patent application Ser. No. 10/628, 369, filed on Jul. 29, 2003, the disclosure of which is hereby incorporated by reference in its entirety.

According to this example, the temperature of the air surrounding the movable components 126b may also be detected based upon the colors of the movable masses 150.

Figure 1D:
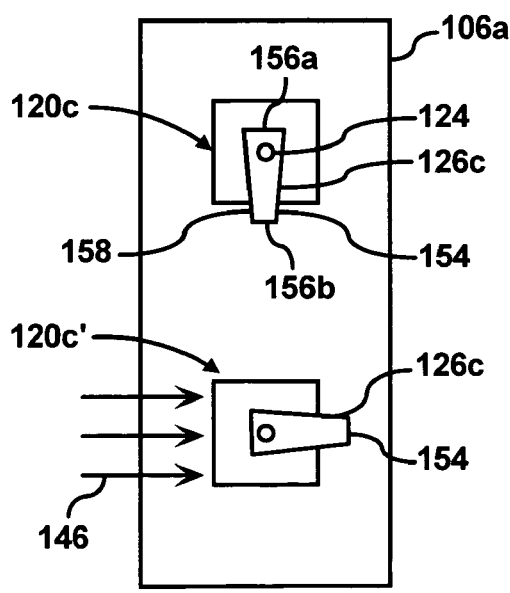
FIG. 1D illustrates a side-elevational view of a rack having airflow indicating devices attached thereon according to a further embodiment of the invention.

FIG. 1D illustrates a side-elevational view of a rack 106a having airflow indicating devices 120c, 120c' attached thereon according to an embodiment of the invention. The rack illustrated in FIG. 1D may, for instance, comprise the rack 106a illustrated in FIG. 1A. Although two airflow indicating devices 120c, 120c' are illustrated in FIG. 1D, any number of airflow indicating devices 120c, 120c' may be provided without departing from the scope of the invention. The determination of the number of airflow indicating devices 120c, 120c' to be employed may be based upon the degree of accuracy desired in detecting the airflow at, for instance, various heights with respect to the rack 106a. Another factor in determining the locations and/or the number of airflow indicating devices 120c, 120c' employed may be based upon varying airflows known to exist at various heights of the rack 106a.

The airflow indicating devices 120c, 120c' are illustrated as comprising movable components 154 rotatably mounted on the supports 124. The movable components 154 may be mounted in any reasonably suitable manner to the supports 124 to generally enable relatively free rotation with respect to the supports 124. The movable components 154 generally comprise hollow structures configured to enable airflow therethrough and are configured to rotate to positions indicative of the direction of the airflow, for instance, the movable components 154 may comprise windsocks. In this regard, the movable components 154 include openings 156a, 156b on opposite ends thereof. The openings 156a may be relatively larger than the openings 156b. The movable components 154 may comprise any known reasonably suitable material, for instance, plastic, fabrics, etc. The sizes of the openings 156a, 156b and/or materials employed for the movable components 154 may be selected according to various factors, for instance, the expected level of airflow in the room 100.

The movable components 154 may be configured to point in a downward direction with respect to the rack 106a when there is little or no airflow around the movable components 154. The position of the movable component 154 with respect to the airflow indicating device 120c may be considered as a starting position 158 of the movable component 154. As air, indicated by the arrows 146, flows around the airflow indicating devices 120c, 120c', the movable component 154 becomes rotated to substantially match the direction of the airflow as shown with respect to the airflow indicating device 120c'.

In addition, the magnitudes of the airflow around the airflow indicating devices 120c, 120c' may be determined in various manners. In one example, the supports 124 may be provided with a sensor (not shown), for instance, a strain gauge, encoder, or the like, to determine the magnitude of the airflow in manners as described hereinabove with respect to FIG. 1C. Any known reasonably suitable calibration technique may be employed to determine a correlation between the information collected by the sensor and the airflow magnitude. If a strain gauge is employed, the level of strain applied on the supports 124 may be determined and correlated to a magnitude of the airflow.

In another example, an apparatus configured to detect airflow magnitude may be employed in conjunction with the movable component 154. The apparatus may comprise any reasonably suitable anemometer, for instance, a vane type anemometer, a hot wire anemometer, etc. In any regard, the information obtained by the sensor may be transmitted as described hereinabove with respect to FIG. 1A.

Any of the above-identified airflow indicating devices 120a-120c may comprise colors and/or materials configured to distinguish them from other components contained in the room 100. In this regard, a technician or automated imaging device may be capable of relatively easily determining their locations as well as the airflows around the respective airflow indicating devices 120a-120c.

FIG. 2A illustrates a side elevational view of an airflow indicating device 200 according to another embodiment of the invention. The airflow indicating device 200 is illustrated as being composed of a pole 202 mounted on an optional base 204. In addition, the optional base 204 may be provided with wheels (not shown) to generally facilitate positioning of the airflow indicating device 200. The pole 202 may comprise a substantially rigid material, for instance, plastic, metal, wood, etc., and may comprise dimensions to generally enable a person or a technician to grasp and carry the pole 202. In one example, the pole 202 may be between approximately 3 to 8 feet in length and have a width between approximately, 1-3 inches. The pole 202 may also comprise any reasonably suitable cross-sectional shape, for instance, circular, rectangular, or have any reasonably suitable number of sides.

The base 204 is considered optional because the airflow indicating device 200 may be employed in various manners. For instance, the airflow indicating device 200 may be hand-carried to various locations in the room 100 to obtain information relating to airflow at the various locations. In this instance, the base 204 may be omitted. As another example, the airflow indicating device 200 may be positioned at various locations in the room 100, in which case, the base 204 may be employed to support the airflow indicating device 200. Although the airflow indicating device 200 is illustrated in a relatively upright position, the airflow indicating device 200 may be positioned at any reasonably suitable angle with respect to the base 204 without departing from the scope of the invention.

Positioned at various heights along the pole 202 are movable components 206. By positioning the movable components 206 at the various heights with respect to the pole 202, for instance, spaced apart from each at around 1-2 feet separation, airflow at the various heights may be visualized. The movable components 206 may be similar or identical to the movable components 126a described hereinabove with respect to FIG. 1B. The movable components 206 are thus configured to indicate the direction of airflow, indicated by the arrows 208, by moving in the direction of the airflow. The movable components 206 may be attached to the pole 202 through optional supports 210 configured to space the movable components 206 from the pole 202. Alternatively, the movable components 206 may be attached directly to the pole 202. The movable components 206 may, for instance, be attached through use of adhesives, mechanical fasteners, hook and loop fasteners, and the like. Although the movable components 206 have been shown and described as being similar or identical to the movable components 126a, other apparatuses, for instance, the movable component 126b, the movable component 154, etc., may be positioned on the pole 202 without departing from the scope of the invention.

According to another example, the airflow indicating device 200 may also include a plurality of sensors 212 positioned at various heights along the pole 202. In FIG. 2A, the sensors 212 are illustrated as being positioned between the movable components 206. Although the movable components 206 and the sensors 212 are illustrated as being distributed relatively evenly along the pole 202, any number of movable components 206 and sensors 212 in any reasonably suitable configuration may be provided on the airflow indicating device 200 without departing from the scope of the invention.

The sensors 212 may comprise temperature detecting devices, for instance, thermometers, thermocouples, and the like. In addition, the sensors 212 may include respective temperature indicators. The temperature indicators may include, for instance, light emitting diodes (LEDs) configured to become activated in response to detected temperatures. By way of example, the LEDs may be configured to become activated when the detected temperatures exceed a predetermined temperature range, for instance, above around 30° C. In this regard, the sensors 212 may function to indicate where the airflow is at its highest along the length of the airflow indicating device 200.

In addition, or alternatively, the sensors 212 may include screens or be wired to a screen configured to display the temperature measurements detected by the sensors 212. In this regard, the temperature measurements may be viewed by a person or technician employing the airflow indicating device 200.

According to another example, the airflow indicating device 200 may be equipped with a plurality of airflow detection apparatuses 214, for instance, anemometers and the like, positioned at various heights along the pole 202. The airflow detection apparatuses 214 may be mounted on the pole 202 to enable the airflow detection apparatuses 214 to face directions of the airflows to thus detect the magnitudes of the airflows. In this regard, the airflow detection apparatuses 214 may be rotatably mounted on the pole 202, for instance, with bearings or otherwise swivel-mounted. The number and positioning of the airflow detection apparatuses 214 shown in FIG. 2A is for purposes of illustration and are not, therefore, intended to limit the invention. In this regard, any number of airflow detection apparatuses 214 positioned at any location along the pole 202 may be employed without departing from the scope of the invention.

The airflow detection apparatuses 214 may comprise any reasonably suitable commercially available apparatuses configured to detect airflow magnitudes. For instance, the airflow detection apparatuses 214 may comprise strain rosettes or other gauges, springs or other mechanical tension detecting devices, MEMS devices, etc. In addition, the airflow detection apparatuses 214 may be equipped with screens (not shown), for instance, LCD displays, configured to display the detected airflow magnitudes. In one regard, a person or technician may be capable of determining the direction of airflow, the temperature of the airflow, and the airflow magnitude at various heights through use of the airflow indicating device 200. In addition, or alternatively, the information obtained by the components of the airflow indicating device 200 may be imaged by one or more of the imaging devices 134 as described hereinabove.

FIG. 2B is a side elevational view of the robotic device 132 illustrated FIG. 1A. The robotic device 132 is generally composed of a vehicle base 220 having a plurality of wheels 202a, 202b to enable travel of the robotic device 132. The arm assembly 140 is illustrated as being attached to the vehicle base 220. In addition, the arm assembly 140 may be rotatable and maneuverable into various positions with respect to the vehicle base 220, for example, with six or more degrees of freedom. A variety of components and/or devices, e.g., sensors, cameras, manipulators, interface devices, etc., may be attached at various locations of the arm assembly 140. As described hereinabove, one of the components attached to the arm assembly 140 may include a manipulator 142. Another component attached to the arm assembly 140 may include a sensor configured to detect temperature, for instance, a thermometer, a thermocouple, and the like. The robotic device 132 may thus be configured to travel to various locations of the room 100 and to detect the temperatures at those locations. In one regard, the robotic device 132 may be capable of supplementing information obtained by the airflow indicating devices 120a-120c, 200, for instance, if they are equipped with temperature sensors. In another regard, the robotic device 132 may be configured to detect temperatures, for instance, at the locations where the airflow indicating devices 120a-120c, 200, generally indicate undesired airflow characteristics.

The movable platform 138 is also illustrated as being attached to the vehicle base 220. The movable platform 138 is further illustrated as being rotatable and maneuverable into various positions with respect to the vehicle base 220, for example, with six or more degrees of freedom. For instance, the movable platform 138 may be able to rotate with respect to the vehicle base 220 through rotation of a rotating device 222. In addition, the height of the movable platform 138 may be varied through operation of a hydraulic device 224. Moreover, for instance, the imaging device 136 may be configured to move with respect to the movable platform 138, also with various degrees of freedom.

Although the arm assembly 140 and the movable platform 138 have been depicted and described as being movable with six or more degrees of freedom, the movable platform 138 and/or the arm assembly 140 may be relatively static with respect to the vehicle base 220 without departing from the scope of the invention. In addition, the robotic device 132 may be configured without an arm assembly 140 or with a retractable arm without departing from the scope of the invention.

According to an example, the robotic device 132 may be configured to grasp one or more of the airflow indicating devices 120a-120c, 200 with the manipulator 142. The robotic device 132 may also position one or more of the airflow indicating devices 120a-120c, 200 at various locations of the room 100. Thus, for instance, robotic device 132 may be configured to grasp an airflow indicating device 120a-120c, 200, and position the airflow indicating device 120a-120c, 200 at a location where it is desired to obtain airflow information. The robotic device 132 may also be configured to image the airflow indicating devices 120a-120c, 200 as described hereinabove.

FIG. 2C is a side elevational view of the robotic device 132 illustrated in FIG. 2B according to another embodiment of the invention. In the embodiment depicted in FIG. 2C, the airflow indicating device 200 illustrated in FIG. 2A is attached to the vehicle base 220. Thus, the robotic device 132 may be configured to travel to a location in the room 100 and obtain airflow information. The robotic device 132 may employ the imaging device 136 to image the airflow indicating device 200 to obtain the airflow information. In addition, the robotic device 132 may comprise hardware and/or software designed to process the information obtained from the images of the airflow indicating device 200.

According to an example, if the robotic device 132 is non-stationary during measurement readings, the robotic device 132 may be configured to account for its speed and direction. Thus, the robotic device 132 may determine its speed and direction, for instance, through use of a global positioning satellite (GPS) system, a compass, reference locations in the room, speedometer, etc. The robotic device 132 may account for its speed and direction of travel during measurement readings to obtain the absolute magnitude of the air as well as the direction of airflow in its vicinity. The robotic device 132 may account for its speed and direction in any reasonably suitable known manner, for instance, through utilization of relatively simple mathematical formulas.

Figure 3:
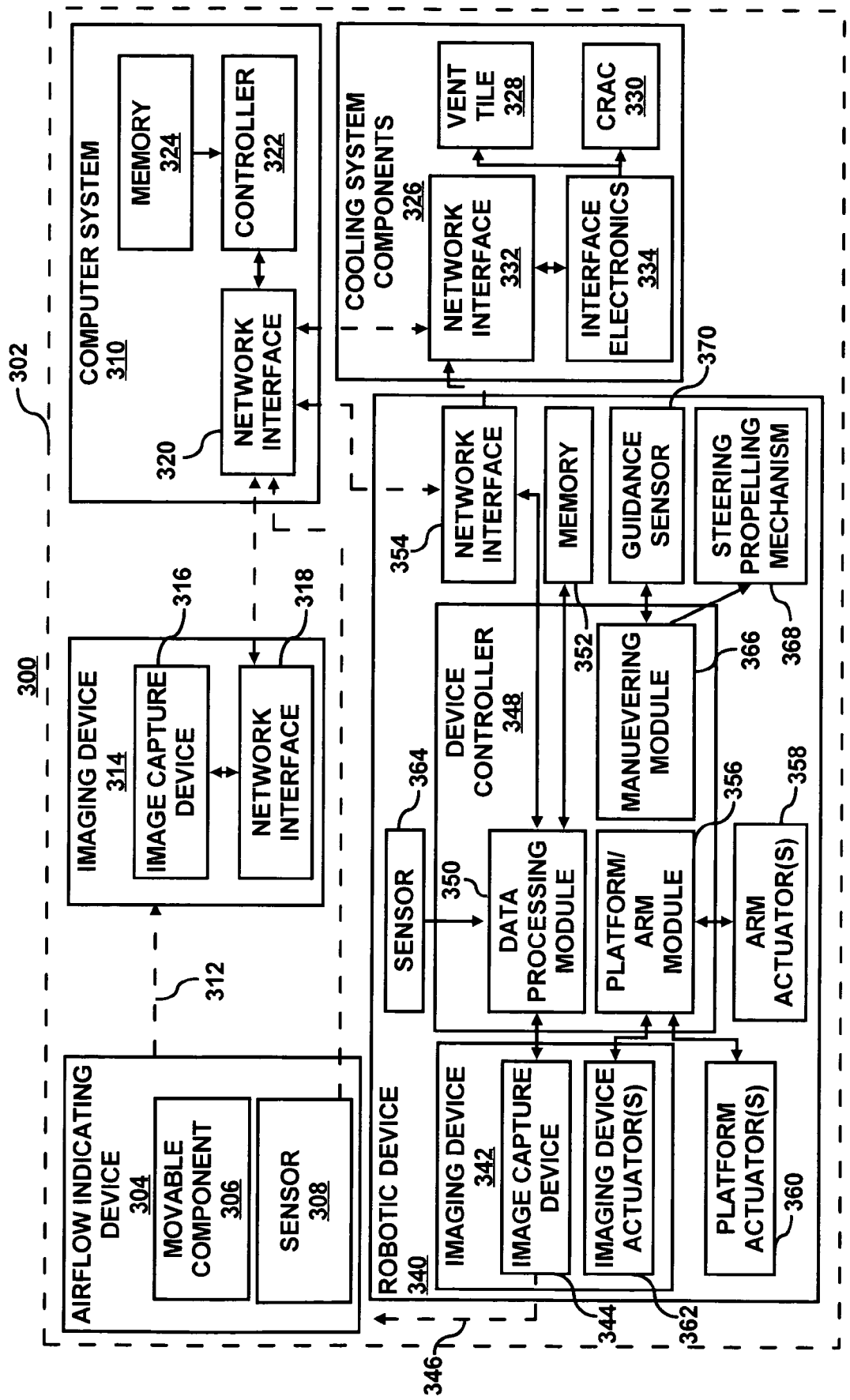
FIG. 3 is an exemplary block diagram of an airflow detection system according to an embodiment of the invention.

FIG. 3 is an exemplary block diagram 300 of an airflow detection system 302 according to an embodiment of the invention. It should be understood that the following description of the block diagram 300 is but one manner of a variety of different manners in which such an airflow detection system 302 may be configured. In addition, it should be understood that the block diagram 300 may include additional components and that some of the components described herein may be removed and/or modified without departing from the scope of the invention. For instance, the block diagram 300 may include any number of airflow indicating devices, robotic devices, imaging devices, computer systems, etc., as well other components that may be implemented in the operations of the airflow detection system 302.

The airflow detection system 302 is illustrated as including an airflow indicating device 304. The airflow indicating device 304 may comprise any of the airflow indicating devices 120a-120c, 200 disclosed and described hereinabove. In this regard, the airflow indicating device 304 generally includes a movable component 306 configured to indicate the direction of airflow in the vicinity of the airflow indicating device 304. The airflow indicating device 304 is also depicted as including an optional sensor 308 configured to detect one or more conditions in the vicinity of the airflow indicating device 304. For instance, the optional sensor 308 may comprise an apparatus configured to detect the magnitude of the airflow either directly, for instance, with an anemometer, or indirectly, for instance, with a strain gauge or encoder as described hereinabove.

If the airflow detection system 302 includes the optional sensor 308, the sensor 308 may be configured to transmit the detected one or more conditions to a computer system 310, for instance, the computer system 130 illustrated in FIG. 1A. To enable communications between the sensor 308 and the computer system 310, the sensor 308 may be wired, for instance, through a network to the computer system 310, or through a wired protocol such as IEEE 802.3, etc. In addition, or alternatively, communicates may be enabled through a wireless protocol, such as IEEE 802.11b, 802.11g, wireless serial connection, Bluetooth, etc. Another wireless communication system employable by the sensor 308 and the computer system 310 comprises location aware sensors. Location aware sensors generally enable wireless data communication between each other and are described in greater detail in commonly assigned and co-pending U.S. patent application Ser. No. 10/620,272, filed on Jul. 9, 2003, the disclosure of which is hereby incorporated by reference in its entirety.

The airflow detection system 302 is also illustrated as including an imaging device 314. The imaging device 314 may comprise the imaging devices 134 illustrated in FIG. 1A and may thus be positioned at one or more locations in the room 100 or may be movable as described hereinabove. The imaging device 314 generally comprises an image capture device 316 configured to image the airflow indicating device 304 as indicated by the arrow 312. The imaging device 314 also includes a network interface 318 configured to enable communication of the captured images to the computer system 310. In this regard, the imaging device 314 may be wired to the computer system 310, for instance, through a common network, or through a wired protocol such as IEEE 802.3, etc. In addition, or alternatively, the imaging device 314 may be configured to communicate with the computer system 310 through a wireless protocol, such as IEEE 802.11b, 802.11g, wireless serial connection, Bluetooth, etc., or through use of location aware sensors as described hereinabove. The computer system 310 also includes a network interface 320 to enable access to the common network or to receive wireless communications from the imaging device 314. The computer system 310 is generally configured to determine the airflow conditions around the airflow indicating device 306 based upon the images received from, for instance, the imaging device 314. The computer system 310 thus includes a controller 322 configured to process the received images and to make various determinations based upon the received images. The controller 322 may comprise a microprocessor, a micro-controller, an application specific integrated circuit (ASIC), and the like.

As described in greater detail hereinabove, the computer system 310 and more particularly, the controller 322 may determine the one or more airflow conditions based substantially upon the airflow indicating devices 304. For purposes of discussion, the airflow indicating device 304 is considered to comprise the airflow indicating device 120a located on a side of the rack 102a in FIG. 1A. The image of the airflow indicating device 120a captured by an imaging device 134 is transmitted to the computer system 310. The controller 322 may determine that the air is flowing around rack 102a from a left side thereof to a right side thereof because the movable component 126a indicates such a movement. In making this determination, the controller 322 may implement imaging software, stored, for instance, in a memory 324. The software may comprise any reasonably suitable commercially available imaging software. The imaging software may be configured to compare the starting position, for instance, the position of the movable component 126a when there is little or no airflow, to the position of the movable component 126a in the image received from the imaging device 134.

In this example, the airflow is detected as flowing from a rear side of the racks 102a-102d to a front side of the racks 102a-102d, where the vent tiles 116 are located to supply cooling fluid to the racks 102a-102d. This airflow may be considered by the controller 322 as inefficient airflow because heated cooling fluid from the racks 102a-102d may be re-circulating into the racks 102a-102d. More particularly, the controller 322 may be configured to operate in various manners as described in commonly assigned and co-pending U.S. patent application Ser. No. 10/446,854, filed on May 29, 2003, the disclosure of which is hereby incorporated by reference in its entirety. As disclosed in that application, a supply heat index may be employed to determine levels of re-circulation at various locations of the room. As further disclosed in that application, various cooling system components may be manipulated to reduce the level of re-circulation in the various locations of the room.

In a similar fashion to those manners disclosed in the Ser. No. 10/446,854 application, the controller 322 may determine manners in which to manipulate one or more cooling system components 326 in response to the detected re-circulation. In addition, or alternatively, the controller 322 may produce an atmospheric map of the room and make cooling system manipulation determinations in manners as described in the Ser. No. 10/123,403 application.

The one or more cooling system components 326 may comprise a plurality of various components as disclosed in the Ser. No. 10/446,854 application. However, for purposes of brevity and clarity of description, only a vent tile 328 and a CRAC 330 are illustrated in FIG. 3. The controller 322 may instruct or otherwise control the one or more cooling system components 326 to vary cooling fluid flow in manners to reduce the level of re-circulation in those areas having adverse levels of re-circulation detected by the airflow indicating device 304. In addition, the controller 322 may transmit the instructions through the network interface 320. The cooling system components 326 may also include a network interface 332 to enable access to the common network or to receive wireless communications from the computer system 310.

The instructions from the computer system 310 may be sent through interface electronics 334. The interface electronics 334 may act as an interface between the computer system 310 and the vent tile 328 and the CRAC 330. By way of example, the interface electronics 334 may manipulate the vent tile 328 to vary a characteristic of the cooling fluid flow delivered therethrough.

The airflow detection system 302 may also include a robotic device 340, for instance, the robotic device 132 illustrated in FIG. 1A. The robotic device 340 is illustrated as comprising an imaging device 342, for instance, the imaging device 136 illustrated in FIG. 1A. The imaging device 342 includes an image capture device 344 configured to image the airflow indicating device 304 as indicated by the arrow 346. The image capture device 342 may operate in manners as described hereinabove with respect to the image capture device 316.

Although not explicitly shown, the imaging device 342 may also include components for transmitting the captured images to a device controller 348 of the robotic device 340. The device controller 348 may include various hardware and/or software for controlling operations of the robotic device 340. In this regard, the device controller 348 may comprise a microprocessor, a micro-controller, an application specific integrated circuit (ASIC), and the like. In addition, or alternatively, the device controller 348 may be part of a computing device that is separate from the robotic device 340, for instance, a laptop computer or other computing device. In this example, the computing device may be supported or otherwise carried by the robotic device 340. Some of the operations capable of being performed by the device controller 238 are described in greater detail hereinbelow.

The device controller 348 may include a data processing module 350 configured to make certain determinations based upon the information received from the imaging device 342. For instance, the data processing module 350 may be configured to store the images obtained by the imaging device 342 in memory 352. The memory 352 may also be configured to provide storage of software that provides the functionality of the robotic device 340. The device memory 352 may be implemented as a combination of volatile and non-volatile memory, such as DRAM, EEPROM, flash memory, and the like.

The data processing module 350 may also be configured to communicate the stored images to the computer system 310 via a network interface 354. The network interface 354 may be configured to enable communications either through a wired connection to the computer system 310 or to a network on which the computer system 310 is attached. The network interface 354 may also enable wireless communications between the robotic device 340 and the computer system 310 in any of the manners described hereinabove.

The computer system 310 may employ the information received from the robotic device 340 and/or the imaging device 314 in making cooling system component 326 operations determinations. In addition, the computer system 310 may be operable to control the cooling system components 326 to vary their operations based upon the determinations made by the computer system 310. A more detailed description of manners in which the computer system 310 may make these determinations along with other examples are set forth in the Ser. No. 10/446,854 application. Additional examples may be found in commonly assigned and co-pending U.S. patent application Ser. No. 10/721,264, filed on Nov. 26, 2003, the disclosure of which is hereby incorporated by reference in its entirety.

In a first example, the data processing module 350 may determine whether the robotic device 340 should immediately proceed to the computer system 310 or to a network connection to transfer information received from the imaging device 342 or to continue along a predefined route. The data processing module 350 may decide to immediate proceed to the computer system 310, for instance, if the received information indicates that the airflow at various locations of the room indicates adverse re-circulation.

In a second example, the device controller 348 may operate as an energy manager for the cooling system components 326. In this example, the data processing module 350 may determine that one or more of the cooling system components 326 are to be varied in response to the information received from the airflow indicating device 304. The data processing module 350 may transmit these changes to the one or more cooling system components 326 through, for instance, the network interface 354. In addition, the network interface 354 may be configured to enable wired or wireless communication between the robotic device 340 and the cooling system components 326.

For instance, communications through the network interface 354 between the robotic device 340 and the cooling system components 326 may be effectuated through a wired protocol, such as IEEE 802.3, etc., or wireless protocols, such as IEEE 802.11b, 802.11g, wireless serial connection, Bluetooth, etc., or combinations thereof. A more detailed description of manners in which the data processing module 350 may make these determinations along with other examples are set forth in the co-pending Ser. No. 10/721,264 application, the disclosure of which is hereby incorporated by reference in its entirety.

The robotic device 340 may comprise the configuration of the robotic device 132 illustrated in FIGS. 1A, 2B and 2C. Thus, the robotic device 340 may include one or more arm actuators 358 for articulating an arm assembly, for instance, the arm assembly 140 or the airflow indicating device 200, into various positions. The arm one or more arm actuators 358 may also manipulate a manipulator, for instance, the manipulator 142. In addition, the robotic device 340 may include one or more actuators 360, 362 configured to articulate the platform and the imaging device, for instance, the platform 138 and the imaging device 136. In any respect, the arm actuator(s) 358, the platform actuator(s) 360 and the imaging device actuator(s) 362 may comprise, for instance, direct current (DC) motors.

Although not explicitly shown, the instructions from the platform/arm module 356 of the device controller 348 may be sent through interface electronics. The interface electronics may act as an interface between the device controller 348 and the arm actuator(s) 358, the platform actuator(s) 360 and the imaging device actuator(s) 362. By way of example, the interface electronics may vary the voltage supplied to the arm actuator(s) 358 to thereby articulate the manipulator into various positions.

The robotic device 340 may also include a sensor 364 configured to detect one or more conditions in an area around the sensor 364. The sensor 364 may be employable to supplement the sensor 308 of the airflow indicating device 304. The sensor 364 may be useful, for instance, because the robotic device 340 is able to move to various locations of the room. In addition, the robotic device 340 may detect conditions at locations where, for instance, there may be a gap in the coverage by the airflow indicating device 304. In addition, the sensor 364 may be used to determine, for instance, if measurements obtained by the sensor 308 is accurate. Moreover, the robotic device 340 may employ the sensor 364 to detect the temperatures around an airflow indicating device 304 that is not equipped with a temperature sensor.

The sensor 364 may transmit or otherwise send the obtained information to the device controller 348. The device controller 348 may store this information in the memory 352. For instance, the memory 352 may store temperature measurements obtained during a condition detection operation along with the locations of the detections. The memory 352 may store this information, for instance, in the form of a table, map, etc.

The device controller 348 may also include a maneuvering module 366 configured to control the movements of the robotic device 340. The maneuvering module 366 may instruct a steering/propelling mechanism 368 configured to control the motivation and direction of travel of the robotic device 340. The steering/propelling mechanism 368 may thus comprise actuators configured to vary these aspects of the robotic device 340 travel. In determining manners in which the steering/propelling mechanism 368 are to be operated, the maneuvering module 366 may employ information received from a guidance sensor 370, e.g., a laser guidance tool, sonar tool, a camera assembly, combinations thereof, and the like, configured to detect the distances of objects located within the field of view of the guidance sensor 370. The received information may, for instance, be in the form of detected positions of objects located around the robotic device 340.

The maneuvering module 366 may process the images received from the guidance sensor 370, for instance, with image recognition software. In this regard, the maneuvering module 366 may determine the objects located within the guidance sensor's 370 field of view, whether the object is an avoidable obstacle, and determine a path around the obstacle if it is avoidable. By way of example, the maneuvering module 366 may operate the steering/propelling mechanism 368 to decrease the speed of the robotic device 340 and alter its course in response to an object being detected in the path of the robotic device 340.

In one respect, the memory 352 may store data/information pertaining to various operations and sensing algorithms responsive to various inputs. For example, the memory 352 may store a map of the room layout and the device controller 348 may access the map to determine a route to follow to arrive at various locations in the room.

Although a robotic device 340 and a single computer system 310 have been illustrated in FIG. 3, it should be understood that any number of robotic devices 340 and computer systems 310 may be included in the airflow detection system 302. As an example, a plurality of robotic devices 340 may be employed to relatively simultaneously collect information from a number of airflow indicating devices 304. In this regard, the time required to collect information from variously located airflow indicating devices 304 may be relatively reduced as compared with use of a single robotic device 340. In another respect, the robotic devices 340 may provide redundancy in providing the data collection function from the airflow indicating device 304.

In yet another respect, the robotic devices 340 may afford increased efficiency in response times as compared with the use of a single robotic device 340. For instance, the robotic devices 340 may be deployed in zones having different thermal characteristics, for instance, various areas of the room that are known to be difficult to maintain within predetermined temperature ranges, etc. As another example, the robotic devices 340 may be deployed according to various time schedules, for instance, one or more robotic devices 340 may be deployed while the batteries of other robotic devices 340 are being charged, etc. In addition, the robotic devices 340 may deployed according to different levels of operation in the room. For instance, the different levels of operation may pertain to various stages of critical operation. In this regard, various robotic devices 340 may be deployed according to the level of critical operation in the room, for instance, the number of robotic devices 340 deployed may increase with increased levels of critical operation and the number of robotic devices 340 deployed may decrease with decreased levels of critical operation.

Figure 4:
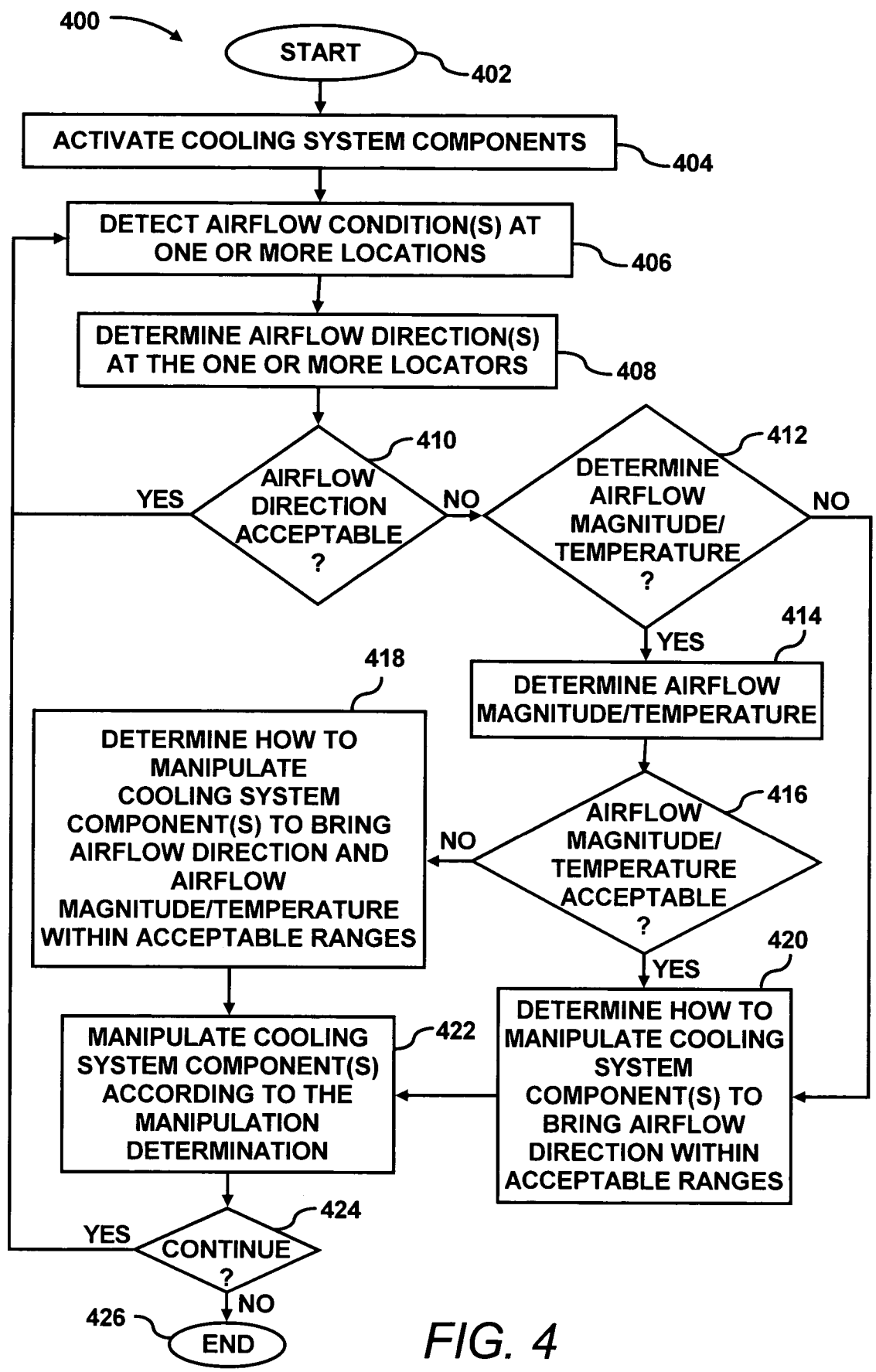
FIG. 4 illustrates an exemplary flow diagram of an operational mode of a method for airflow detection in a room according to an embodiment of the invention.

FIG. 4 illustrates an exemplary flow diagram of an operational mode 400 of a method for airflow detection in a room according to an embodiment of the invention. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from the scope of the invention.

The description of the operational mode 400 is made with reference to the block diagram 300 illustrated in FIG. 3, and thus makes reference to the elements cited therein. It should, however, be understood that the operational mode 400 is not limited to the elements set forth in the block diagram 300. Instead, it should be understood that the operational mode 400 may be practiced by a airflow detecting system having a different configuration than that set forth in the block diagram 300.

The operational mode 400 may be initiated in response to a variety of stimuli at step 402. For example, the operational mode 400 may be initiated in response to a predetermined lapse of time, in response to receipt of a transmitted signal, manually initiated, etc. At step 404, the cooling system components 326 may be activated. An imaging device 316 and/or a robotic device 340 may also be activated at step 404 if the airflow detecting system 302 includes these devices.

At step 406, the airflow conditions at one or more locations of the room 100 may be detected. According to one example, step 406 may be preceded by a step of positioning one or more of the airflow indicating devices 304 at the one or more locations of the room 100. The step of positioning the one or more airflow indicating devices 304 may comprise manually placing the one or more airflow indicating devices 304 at the one or more locations of the room 100 as shown in FIG. 1A. In addition, this step may comprise manual placement of the one or more airflow indicating devices 304 as shown in FIG. 2A. This step may also comprise support of the one or more airflow indicating devices 304 by a technician in the room 100. As a further example, this step may comprise positioning of the one or more airflow indicating devices 304 by maneuvering a robotic device 340 having an airflow indicating device 304 as shown in FIG. 2C to a location of the room 100.

In addition, or alternatively, to the manual placement of the one or more airflow indicating devices 304, the one or more airflow indicating devices 304 may be positioned and placed by the robotic device 340 as described hereinabove.

At step 408, the airflow directions at the one or more locations of the room 100 may be determined. In one example, the airflow directions may be visually determined. In this regard, a technician may be capable of viewing the one or more airflow indicating devices 304 either directly or indirectly, for instance, through an imaging device 316, 342 and a display (not shown) to determine the airflow directions based upon the configurations of the one or more airflow indicating devices 304.

As another example, at step 408, the airflow directions at the one or more locations may be determined by the computer system 310. In this example, images of the one or more airflow indicating devices 304 may be captured by one or more imaging devices 314, 342. The captured images may be transmitted to the computer system 310 and the computer system 310 may process the images. In terms of processing the images, the computer system 310 may include image recognition software configured to, for instance, compare a known starting position of the movable components 306 of the airflow indicating devices 304 with their positions in the received images. Through a comparison of these positions, the computer system 310 may be capable of determining, for instance, the direction of airflow in the respective vicinities of the one or more airflow indicating devices 304.

In another example, the functionalities of the computer system 310 may be embodied in the robotic device 340. Thus, for instance, the robotic device 340 may be configured to receive and process images received from the imaging devices 316, 342. In addition, the robotic device 340 may include image recognition software and may determine the airflow directions in the respective vicinities of the one or more airflow indicating devices 304.

If the robotic device 340 is employed, the robotic device 340 may also be programmed with instructions by either or both of a technician or the computer system 310. The programming may comprise, for instance, a map of the room, the locations of the airflow indicating devices 304, the locations of computer systems 340, the locations of cooling system components 326, etc.

The programming may also include various operations for the robotic device 340 to perform. For instance, the robotic device 340 may be programmed to position various airflow indicating devices 304 at various locations in the room 100. The programming may also comprise a timing schedule for the robotic device 340. More particularly, the robotic device 340 may be programmed to obtain images of various airflow indicating devices 304 at various times. By way of example, the robotic device 340 may be programmed to more frequently obtain images of airflow indicating devices 304 located in areas where re-circulation problems have historically existed. As other examples, the robotic device 340 may be programmed to more frequently obtain images of airflow indicating devices 304 located in areas of greater criticality, based upon service level agreements, etc.

In addition, or alternatively, the robotic device 340 may be programmed to traverse the room 100 according to a set routine. More particularly, the robotic device 340 may be programmed to obtain images of airflow indicating devices 304 located at various positions in the room 100 to substantially maximize information retrieval within a predetermined period of time, for instance, according to a Manhattan algorithm. By way of example, the robotic device 340 may be programmed to obtain images from less than all of the airflow indicating devices 1304 in a particular area during a run through the room 100 to reduce the amount of time required to obtain that information.

As another example, the routing algorithm programmed into the robotic device 340 may categorize the airflow indicating devices 304 into a plurality of groups. The groups for the airflow indicating devices 304 may be selected according to historical data pertaining to the areas associated with the airflow indicating devices 304. For instance, in a two category grouping, the routing algorithm may assign those of the airflow indicating devices 304 having associated areas where re-circulation problems have historically existed in a first group. The others of the airflow indicating devices 304 may be assigned to a second group.

The routing algorithm may, for example, devise a route that enables the robotic device 340 to visit those airflow indicating devices 304 in the first group first or more frequently than those airflow indicating devices 304 in the second group. A more detailed description of manners in which various areas of a room may be categorized into a plurality of groups is described in greater detail in co-pending and commonly assigned U.S. patent application Ser. No. 10/639,428, filed on Aug. 13, 2003, the disclosure of which is hereby incorporated by reference in its entirety. Additional manners in which the routing algorithm may be implemented to control operations of the robotic device 132, 340 are disclosed in the Ser. No. 10/721,264 application, the disclosure of which is also hereby incorporated by reference in its entirety.

In addition, a plurality of robotic devices 340 may be programmed to operate substantially simultaneously to thereby reduce the amount of time required to obtain images of the airflow indicating devices 304. In this regard, the plurality of robotic devices 340 may be assigned to various areas of the room 100 or to operate at various times, for instance, some of the robotic devices 340 may execute the operational mode 400 while others of the robotic devices 340 are recharging their batteries. In addition, the robotic devices 340 may operate as back-ups for other robotic devices 340, for instance, should they malfunction or require maintenance.

At step 410, it may be determined whether airflow directions at the one or more locations are acceptable. An airflow direction may be considered as being unacceptable, for instance, if an appreciable amount of air flows from a hot aisle into a cool aisle. This type of airflow may be an indication that air or cooling fluid heated in the racks is being re-circulated into the racks. One result of this type of airflow is that a greater amount of energy may be required to maintain the components housed in the racks within predetermined temperature ranges. Another result may be that the components housed in the racks may actually be heated by the air or cooling fluid.

As another example, an airflow direction may be considered as being unacceptable, for instance, if an appreciable amount of air or cooling fluid supplied from the vent tiles 328 is relatively directly, that is, without flowing through the racks, flowing into the returns of the CRAC 330 in the room 100. A result of this type of airflow is that a greater amount of energy may be expended in maintaining the components housed in the racks within predetermined temperature ranges because some of the cooling fluid supplied to cool the components is being wasted.

An airflow direction may be considered as being acceptable, for instance, if the airflow direction shows a minimal amount of adverse re-circulation. Acceptable adverse re-circulation levels may be based upon, for instance, individual tolerance levels, service level agreements, energy consumption thresholds, cooling-to-energy use optimization schemes, etc. In addition, airflow directions may be considered as being acceptable, for instance, if heated cooling fluid or air from the racks is being directly drawn into the returns.

In one example, a technician may be capable of determining whether the airflow directions at the one or more locations are acceptable at step 410. In another example, the computer system 310 and/or the robotic device 340 may be capable of determining whether the airflow directions are acceptable at step 410. In this regard, the computer system 310 and/or the robotic device 340 may be configured, for instance, to compare the images of the airflow indicating devices 304 with acceptable airflow directions. As yet another example, if the airflow indicating devices 304 include markings 144 (FIG. 1B), the computer system 310 and/or the robotic device 340 may be configured to determine whether the airflow directions are acceptable based upon the orientations of the movable components 206 with respect to the markings 144.

If the airflow directions are considered acceptable, steps 406-410 may be repeated. If the airflow directions are considered as being unacceptable, it may be determined whether the airflow magnitudes and or temperatures in the vicinities of the airflow indicating devices 304 are to be determined at step 412. The determination of whether to detect the airflow magnitudes or temperatures may be based on the configurations of the airflow indicating devices 304. For instance, one or both of these conditions may be detected if the airflow indicating devices 304 include sensors configured to detect these conditions. In addition, or alternatively, this determination may be based upon the level of control desired over the conditions in the room 100. For instance, if it is determined that control decisions over cooling system component 326 operations are to be substantially based upon the airflow directions, then it may be unnecessary to determine the airflow magnitudes and temperatures. However, if it is determined that airflow magnitudes and/or temperatures are to be employed in controlling cooling system component 326 operations, the airflow magnitudes and/or temperatures may be detected as indicated at step 414.

At step 414, the airflow magnitudes and/or temperatures may be determined in a variety of different manners. For instance, if the airflow indicating devices 304 are equipped with sensors configured to detect either or both of these conditions, the information detected may be transmitted to the computer system 310 and/or the robotic device 340 in manners as described hereinabove. In addition, or alternatively, the robotic device 340 may be configured to travel to the locations of where the airflow magnitudes and/or temperatures are to be determined and obtain the desired condition information. The robotic device 340 may also transmit or otherwise communicate the detected condition information to the computer system 310 in manners as described hereinabove.

At step 416, the computer system 310 and/or the robotic device 340 may determine whether the airflow magnitudes and/or the temperatures are acceptable. Airflow magnitudes may be considered acceptable if they are within predetermined threshold values. The predetermined threshold values may be set according to, for instance, individual tolerance levels, service level agreements, energy consumption thresholds, cooling-to-energy use optimization schemes, etc. If it is determined that either or both of the airflow magnitudes and temperatures are unacceptable, a determination of how to manipulate one or more cooling system components 326 to bring airflow directions and either or both of airflow magnitudes and temperatures within acceptable ranges may be made at step 418. This determination may be made based upon prior testing of various cooling schemes, the results of which may be stored in either or both of the computer system 310 and the robotic device 340, for instance, in the form of a look-up table which the computer system 310 and/or the robotic device 340 may access. The manipulation determination may also be based upon the implementation of an iterative process configured to make various cooling system component 326 manipulations, determine their outcomes, and make further adjustments as necessary.

If it is determined at step 412 that the airflow magnitudes and the temperatures are not to be determined or if it is determined as step 416 that the airflow magnitudes and/or temperatures are acceptable, a determination of how to manipulate the one or more cooling system components 326 to bring airflow directions within acceptable ranges may be made at step 420. This determination may be made in similar fashion to that described hereinabove with respect to step 418.

At step 422, the one or more cooling system components 426 may be manipulated according to the determinations made in either step 418 and 420. Manners in which the computer system 310 and/or the robotic device 340 may operate the one or more cooling system components 326 are described, for instance, in the co-pending Ser. Nos. 10/446,854 and 10/721,264 applications, the disclosures of which are hereby incorporated by reference in their entireties.

At step 424, for instance, the robotic device 340 and/or technician may determine whether it is to continue the operational mode 400. This determination may be based upon the algorithm executed by the robotic device 340 or the instructions received by the technician. If the robotic device 340 and/or technician determines that the operational mode 400 is to continue, steps 406-424 may be repeated. If it is determined that the operational mode 400 is to be discontinued, for instance, a time period expires, the components in the room are powered down, the operational mode 400 is manually discontinued, etc., the robotic device 340 and/or the technician may end the operational mode 400 as indicated at step 426. Step 426 may be similar to an idle mode for the operational mode 400 since the operational mode 400 may be reactivated, for instance, when the components of the room become activated, after a predetermined period of time, in response to manual input to reactivate the operational mode 400, etc.

The operations set forth in the operational mode 400 may be contained as a utility, program, or subprogram, in any desired computer accessible medium. In addition, the operational mode 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
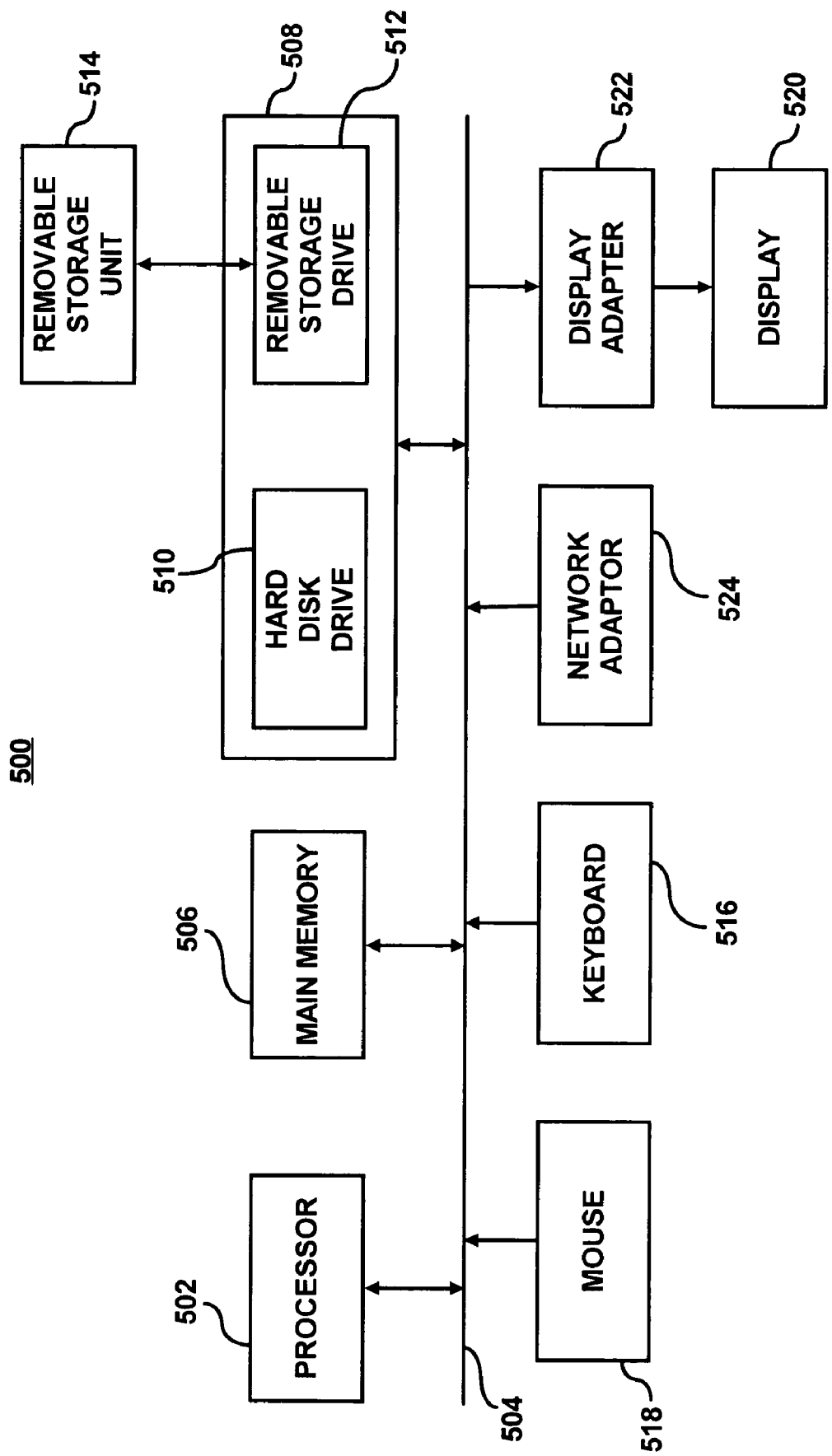
FIG. 5 illustrates an exemplary computer system, according to an embodiment of the invention.

FIG. 5 illustrates an exemplary computer system 500, according to an embodiment of the invention. The computer system 500 may include, for example, the device controller 348 and/or the computer system 310. In this respect, the computer system 500 may be used as a platform for executing one or more of the functions described hereinabove with respect to the various components of the airflow detecting system 302.

The computer system 500 includes one or more controllers, such as a processor 502. The processor 502 may be used to execute some or all of the steps described in the operational mode 400 described hereinabove. Commands and data from the processor 502 are communicated over a communication bus 504. The computer system 500 also includes a main memory 506, such as a random access memory (RAM), where the program code for, for instance, the device controller 348 and/or the controller of the computer system 310, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, e.g., the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (e.g., user input devices, secondary memory, etc.).

By virtue of certain embodiments of the invention, a plurality of relatively inexpensive airflow indicating devices are implemented to determine air circulation in a room. In addition, a robotic device may be employed to collect information regarding the circulation of air from the airflow indicating devices or by obtaining various condition information on its own. The robotic device may operate as a means of conveying information obtained from various locations of the room to a computer system configured to control cooling system operations. In this regard, the computer system may be configured to relatively easily determine areas where adverse air re-circulation may be occurring and to take measures to substantially reduce the adverse air re-circulation.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for detecting airflow in a room, said system comprising:
   an airflow indicating device having a movable component whose movement directly corresponds to a direction of airflow in a vicinity of the airflow indicating device;
   one or more imaging devices positioned to image the airflow indicating device;
   cooling system components; and
   a computer system, said one or more imaging devices being configured to transmit obtained images of the airflow indicating device to the computer system, and wherein the computer system is configured to control the cooling system components substantially based upon movement of the movable component.

2. The system according to claim 1, wherein the movable component comprises a nearly massless streamer configured to flow in the direction of airflow in a vicinity of the airflow indicating device.

3. The system according to claim 1, wherein the movable component comprises a movable mass configured to rotate about an axis in response to airflow in a vicinity of the airflow indicating device.

4. The system according to claim 3, wherein the movable mass comprises a color changing material, said color changing material configured to change color based upon a temperature of the air in the vicinity of the airflow indicating device.

5. The system according to claim 1, wherein the movable component comprises a windsock configured to rotate about an axis in response to airflow in a vicinity of the airflow indicating device.

6. The system according to claim 1, wherein the airflow indicating device comprises at least one sensor configured to detect airflow magnitude.

7. The system according to claim 1, wherein the airflow indicating device comprises at least one sensor configured to detect temperature in a vicinity of the airflow indicating device.

8. The system according to claim 1, wherein the airflow indicating device comprises a pole having a height, said pole comprising a plurality of movable components attached at various heights of the pole.

9. The system according to claim 8, wherein the pole further comprises a plurality of sensors attached at various heights of the pole.

10. The system according to claim 9, wherein the sensors are attached to one or more temperature indicators.

11. The system according to claim 8, wherein the pole comprises a base configured to support the pole.

12. The system according to claim 8, wherein the airflow indicating device is attached on a robotic device configured to traverse the room.

13. The system according to claim 1, wherein the one or more imaging devices are movable.

14. The system according to claim 1, further comprising:
a robotic device configured to traverse the room, said robotic device comprising at least one of the one or more imaging devices configured to image the airflow indicating device and a memory to store the image.

15. The system according to claim 14, wherein the robotic device is configured to communicate with the computer system and to transmit the stored image.

16. The system according to claim 15, wherein at least one of the robotic device and the computer system comprises image recognition software configured to determine the movement of the movable component.

17. The system according to claim 14, wherein the robotic device further comprises a manipulator configured to grasp and position the airflow indicating device.

18. The system according to claim 14, wherein the robotic device comprises the computer system.

19. A system for detecting airflow in a room, said system comprising:
a pole;
a plurality of movable components attached at various heights of the pole, wherein the plurality of movable components are configured to move in a direction of the airflow in a vicinity of the pole to thereby indicate the direction of airflow; and
one or more imaging devices positioned in the room to image the plurality of movable components, said one or more imaging devices being configured to transmit obtained images of the plurality of movable components to a computer system.

20. The system according to claim 19, further comprising a plurality of sensors attached at various heights of the pole, wherein the plurality of sensors are configured to detect at least one of airflow magnitude and temperature.

21. The system according to claim 20, wherein the sensors are attached to one or more temperature indicators configured to visually indicate the temperatures at one or more of the heights of the pole.

22. The system according to claim 19, wherein the pole comprises a base configured to independently support the pole.

23. The system according to claim 19, wherein the pole is attached on a robotic device configured to traverse the room.

24. A method for reducing air re-circulation in a room, said method comprising:
detecting one or more airflow conditions at one or more locations in the room;
determining airflow directions at the one or more locations;
determining whether the airflow directions are acceptable; and
manipulating one or more cooling system components to bring airflow directions within acceptable ranges in response to the airflow directions being unacceptable to thereby reduce air re-circulation in the room.

25. The method according to claim 24, further comprising:
positioning a plurality of airflow indicating devices having movable components at the one or more locations in the room; and
wherein the step of determining airflow directions comprises visually determining movement of the movable components to determine the airflow directions.

26. The method according to claim 25, wherein the step of visually determining movement comprises imaging the plurality of airflow indicating devices with one or more imaging devices.

27. The method according to claim 26, wherein the step of imaging the plurality of airflow indicating devices comprise imaging the plurality of airflow indicating devices with an imaging device of a robotic device configured to traverse the room.

28. The method according to claim 27, wherein the robotic device comprises a manipulator, and wherein the step of positioning the plurality of airflow indicating devices comprises positioning the plurality of airflow indicating devices with the manipulator of the robotic device.

29. The method according to claim 25, further comprising:
determining at least one of airflow magnitude and temperature in the vicinities of the plurality of airflow indicating devices in response to the airflow directions being unacceptable.

30. The method according to claim 29, further comprising:
determining whether at least one of the airflow magnitudes and temperatures is acceptable; and
wherein the step of manipulating one or more cooling system components comprises manipulating the one or more cooling system components to bring at least one of airflow directions, airflow magnitudes and temperatures within acceptable ranges in response to at least one of the airflow magnitudes and temperatures being unacceptable.

31. The method according to claim 29, wherein the step of determining at least one of airflow magnitude and temperature in the vicinities of the plurality of airflow indicating devices comprises detecting at least one of the airflow magnitude and temperature with one or more sensors of a robotic device configured to traverse the room.

32. The method according to claim 25, wherein movable components of the plurality of airflow indicating devices comprise a starting position, and wherein the step of determining airflow directions at the one or more locations comprises implementing an image recognition software configured to determine a deviation of the movable components from the starting positions.

33. A system for reducing air re-circulation in a room, said system comprising:
means for detecting one or more airflow conditions at one or more locations in the room;
means for determining airflow directions at the one or more locations;
means for determining whether the airflow directions are acceptable; and
means for manipulating one or more cooling system components to bring airflow directions within acceptable ranges to thereby reduce air re-circulation in the room.

34. The system according to claim 33, further comprising:
means for imaging the means for determining airflow directions.

35. The system according to claim 34, wherein the means for imaging comprises at least one of a movable imaging device and an imaging device of a robotic device.

36. The system according to claim 33, further comprising:
means for positioning the means for determining airflow directions.

37. The system according to claim 33, further comprising:
means for determining at least one of airflow magnitude and temperature in the vicinities of the means for determining airflow directions.

38. A computer readable storage medium on which is embedded one or more computer programs, said one or more computer programs implementing a method for reducing air re-circulation in a room, said one or more computer programs comprising a set of instructions for:
detecting one or more airflow conditions at one or more locations in the room;
determining airflow directions at the one or more locations;
determining whether the airflow directions are acceptable; and
manipulating one or more cooling system components to bring airflow directions within acceptable ranges in response to the airflow directions being unacceptable to thereby reduce air re-circulation in the room.

39. The computer readable storage medium according to claim 38, said one or more computer programs further comprising a set of instructions for:
visually determining movement of airflow indicating devices to determine the airflow directions.

40. The computer readable storage medium according to claim 39, said one or more computer programs further comprising a set of instructions for:
imaging the airflow indicating devices with one or more imaging devices.

41. The computer readable storage medium according to claim 39, said one or more computer programs further comprising a set of instructions for:
determining at least one of airflow magnitude and temperature in the vicinities of the plurality of airflow indicating devices in response to the airflow directions being unacceptable.

42. The computer readable storage medium according to claim 41, said one or more computer programs further comprising a set of instructions for:
determining whether at least one of the airflow magnitudes and temperatures is acceptable; and
manipulating the one or more cooling system components to bring at least one of airflow directions, airflow magnitudes and temperatures within acceptable ranges in response to at least one of the airflow magnitudes and temperatures being unacceptable.

43. The computer readable storage medium according to claim 39, wherein the airflow indicating devices comprise movable components having starting positions, said one or more computer programs further comprising a set of instructions for:
implementing an image recognition software configured to determine a deviation of the movable components from the starting positions.

* * * * *